(12) United States Patent
Kang et al.

(10) Patent No.: US 7,280,391 B2
(45) Date of Patent: Oct. 9, 2007

(54) PHASE CHANGE MEMORY DEVICE FOR USE IN A BURST READ OPERATION AND A DATA READING METHOD THEREOF

(75) Inventors: Sang-Beom Kang, Seoul (KR); Woo-Yeong Cho, Hwaseong-si (KR)

(73) Assignee: Samsung Electronics Co., LLC, Suwon-si (KR)

( * ) Notice: Subject to any disclaimer, the term of this patent is extended or adjusted under 35 U.S.C. 154(b) by 101 days.

(21) Appl. No.: 11/184,184

(22) Filed: Jul. 19, 2005

(65) Prior Publication Data

US 2006/0013058 A1    Jan. 19, 2006

(30) Foreign Application Priority Data

Jul. 19, 2004    (KR) ............... 10-2004-0055858

(51) Int. Cl.
*G11C 11/00*    (2006.01)
*G11C 7/10*    (2006.01)

(52) U.S. Cl. ............ 365/163; 365/148; 365/238.5

(58) Field of Classification Search .......... 365/163
See application file for complete search history.

(56) References Cited

U.S. PATENT DOCUMENTS

| | | | | |
|---|---|---|---|---|
| 6,707,712 B2* | 3/2004 | Lowery | ............... | 365/175 |
| 6,754,107 B2* | 6/2004 | Khouri et al. | ......... | 365/185.23 |
| 6,862,235 B2* | 3/2005 | Sakata et al. | ............... | 365/202 |
| 6,909,656 B2* | 6/2005 | Moore et al. | ............... | 365/222 |
| 6,965,533 B2* | 11/2005 | Sakata et al. | ............... | 365/202 |
| 6,982,913 B2* | 1/2006 | Oh et al. | ............... | 365/203 |
| 7,002,833 B2* | 2/2006 | Hush et al. | ............... | 365/100 |
| 7,038,961 B2* | 5/2006 | Sakata et al. | ............... | 365/205 |
| 7,042,760 B2* | 5/2006 | Hwang et al. | ............... | 365/163 |
| 7,099,180 B1* | 8/2006 | Dodge et al. | ............... | 365/148 |
| 7,116,593 B2* | 10/2006 | Hanzawa et al. | ............... | 365/203 |
| 2003/0156463 A1* | 8/2003 | Casper et al. | ......... | 365/189.07 |

* cited by examiner

*Primary Examiner*—Son L. Mai
(74) *Attorney, Agent, or Firm*—F. Chau & Assoc., LLC

(57) ABSTRACT

A phase change memory device for use in a burst read operation and a data reading method are provided. The memory device includes a plurality of bit lines and a plurality of word lines. A memory cell array block has a plurality of phase change memory cells that are connected to cross points of the plurality of bit lines and the plurality of word lines. A sense amplifier block is connected to corresponding bit lines, and latches data of memory cells connected to the same word line simultaneously during a burst read operation, and then provides the latched data in response to a column address.

17 Claims, 6 Drawing Sheets

PHASE CHANGE MEMORY DEVICE FOR USE IN A BURST READ OPERATION AND A DATA READING METHOD THEREOF

TECHNICAL FIELD

The present invention relates to a semiconductor memory device, and more particularly, to a phase change memory device for use in a burst read operation, and a data reading method thereof.

DISCUSSION OF THE RELATED ART

In general, a phase change material is set in one of two physical states. This enables data to be stored in a phase change memory cell formed of a phase change material. A first physical state of the phase change material may typically be a high resistance state, and a second physical state may be a low resistance state. Thus, for example, when the high resistance state is represented by a binary value of 1, the low resistance state is represented by a binary value of 0.

A phase change memory device such as a Phase change Random Access Memory (PRAM), which has a plurality of phase change memory cells, is generally produced by using a characteristic such that its resistance changes during a phase transition based on a change in temperature. When employing a PRAM in an electronic system such as a computer, data stored in a memory cell of the PRAM is preserved even if a power source is removed. In other words, the PRAM is a nonvolatile memory device, unlike that of a volatile Dynamic Random Access Memory (DRAM). Further, the PRAM is capable of a high-speed operation and low power consumption.

Referring to FIG. 1, a conventional phase change memory cell C is constructed of one access transistor AT connected to a word line WL and one variable resistor GST connected to a bit line BL. Although the variable resistor GST is shown connected to a bit line BL, the variable resistor GST may be connected between a source terminal of the access transistor AT and a ground voltage GND.

The variable resistor GST is formed of a phase change material, in which a phase is changed to a crystalline or an amorphous state by increasing a temperature applied thereto and heating it over time. This results in changing a resistance value of the phase change material. The variable resistor GST may be formed using, e.g., $Ge_xSb_yTe_z$ (GST). When changing, for example, from an amorphous state to a crystalline state in the GST, a non-resistance thereof is increased by a factor of 1000. An exemplary memory cell formed of the GST is disclosed in U.S. Pat. No. 6,605,821.

When heating the GST, a laser beam may be used or a current may be applied. The method of applying current to heat the GST is typically used when manufacturing a memory chip. When using current to heat the GST, current pulses are provided to a bit line BL to write data. In other words, the GST goes to a crystalline state or an amorphous state by performing a joule heating generated by a magnitude of and time that the current is applied. Here, it is assumed that 'set' is a case when a state of the GST is changed from an amorphous state to a crystalline state and 'reset' is a case when a state of the GST is changed from a crystalline state to an amorphous state.

Write and read operations in the PRAM will be described as follows.

A write operation of the PRAM is performed in accordance with a graph of FIG. 2. In particular, FIG. 2 illustrates a phase change property over time in view of temperature for the GST of FIG. 1. In the graph of FIG. 2, a transverse axis indicates a time (t) and a longitudinal axis designates a temperature T (TEM). When storing write data in a phase change memory cell connected between a first word line and a first bit line within a memory cell array, the first word line is activated by a row decoding operation of a main decoder. The first bit line is selected by a column decoding operation of a column path and column decoder. Write data applied through a data input buffer is provided to a write driver. The write driver applies a reset current pulse having a pulse width T1 of FIG. 2 to a first bit line when the write data has a logic level of 1. When the reset current pulse is applied to the first bit line, a GST of a selected phase change memory cell receives temperature based on a temperature graph SP of FIG. 2 and is then reset. The reset memory cell has a high resistance state and can function as a memory cell having a stored data of 1. In other words, storage data of "1" is obtained when performing the write operation or programming operation by heating a GST thin film over a melting temperature Tm as shown in the graph SP of FIG. 2 and then by rapidly quenching it to change the GST to an amorphous state.

Storage data of "0" is obtained by heating the GST over a crystallization temperature Tx and under a melting temperature Tm as shown in the graph of FIG. 2 for a predetermined time, and then by quenching it to change the GST to a crystalline state.

An example of a write operation being performed in a PRAM is disclosed in U.S. Pat. No. 6,545,907. In particular, U.S. Pat. No. 6,545,907 discloses a method of performing a write operation by using a reset pulse and a set pulse as a write current.

A read operation of a PRAM will be described as follows.

When a first word line and a first bit line are selected by a word and a bit line, data written in a memory cell of 1 or 0 is read through the first bit line. For example, if data 1 is stored, a selected memory cell has a high resistance state, thus a level of cell-through current flowing from a bit line BL to a ground is relatively low as shown in FIG. 1. In contrast, if data 0 is stored, the memory cell has a low resistance state and a level of the cell-through current is relatively high. In other words, a current sense amplifier for sensing a current change through the cell-through current is connected to the bit line BL and is driven, thereby it can be determined whether data stored in the memory cell is 1 or 0. Here, if a GST state is changed, information or data of the memory cell is not preserved. To prevent this, a voltage level at both ends of the memory cell should be high enough to be heated to a point lower than a crystallization temperature. Consequently, data read as 1 or 0 can be output from a device including the PRAM through a column path and column decoder.

An example of reading data from a phase change memory cell is disclosed in U.S. Pat. No. 6,608,773.

In a memory capable of a high-speed operation, a burst read operation is typically used. In a burst read operation of a DRAM, data of memory cells connected to a selected word line are latched, at one time, and the latched data is output by a sequentially changed column address, thus a high-speed output can be performed.

In a conventional phase change memory it is difficult to perform a burst read operation during a high-speed operation. Hence, a memory core circuit capable of effectively executing such a burst read operation is needed for a PRAM.

SUMMARY OF THE INVENTION

Exemplary embodiments of the invention include a phase change memory device for use in a burst read operation, and a data reading method for use in a phase change memory device having a burst read operation.

According to an aspect of the invention, a phase change memory device includes a plurality of bit lines and a plurality of word lines; a first memory cell array block having a plurality of phase change memory cells that are connected to cross points of the plurality of bit lines and the plurality of word lines; and a sense amplifier block, which is connected to corresponding bit lines, wherein the sense amplifier block latches data of the memory cells connected to the same word line simultaneously during a burst read operation, and provides the latched data in response to a column address.

Sense amplifiers constituting the sense amplifier block are connected to each bit line, and the sense amplifiers may be disposed in two lines between memory cell array blocks. A sense reference voltage applied to one of the sense amplifiers may be a reference voltage applied from the outside, and may be half a power source voltage. After activating the sense amplifier, the sense reference voltage is not applied to the sense amplifier.

The sense amplifiers include a plurality of N-type MOS transistors coupled to a plurality of P-type MOS transistors forming an inverter latch.

The phase change memory device also comprises: a plurality of pre-discharging parts that discharge a plurality of sense lines and the plurality of bit lines; a clamping part that electrically switches between one of the sense amplifiers and one of the first memory cell array block or a second memory cell array block and that prevents a voltage of one of the plurality of bit lines from exceeding a predetermined level; and a current supply part that supplies a reading or writing current to one of the first memory cell array block or a second memory cell array block.

A data reading method in a phase change memory device, wherein the phase change memory device includes a plurality of bit lines and a plurality of word lines, a memory cell array block having a plurality of phase change memory cells that are connected with cross points of the plurality of bit lines and the plurality of word lines, and a sense amplifier block connected to corresponding bit lines, includes: selecting one word line from the plurality of word lines; latching, simultaneously, data of memory cells connected to the selected word line; and outputting the latched data during a read cycle in response to a column address. The one word line corresponds to a row address.

When selecting the one word line from the plurality of word lines, an access transistor of one of the memory cells is turned on to form a current path between a variable resistor and one of the memory cells connected to one of the plurality of bit lines and a ground. A current is also supplied to the current path to determine a resistance state of the variable resistor.

The method further comprises: forming an electrical connection between a sense amplifier of the sense amplifier block and a selected memory cell array block and applying a column address after latching the data of memory cells connected to the selected word line. The column address is sequentially changed. The column address is sequentially changed when an active state of a row address remains intact.

BRIEF DESCRIPTION OF THE DRAWINGS

Exemplary embodiments of the invention are described with reference to the accompanying drawings, of which.

DETAILED DESCRIPTION OF EXEMPLARY EMBODIMENTS

Exemplary embodiments of the present invention will be described with reference to FIGS. 4 through 7 in which like components having like functions are provided with like reference symbols and numerals.

To provide a more thorough description of the invention, the structure of a memory core circuit for performing a burst read operation in a conventional DRAM will be described with reference to FIG. 3. A conventional circuit structure of the DRAM for performing a burst read operation has a characteristic that data of memory cells that share the same word line are latched at one time within each sense amplifier having a latch function.

Figure 1:
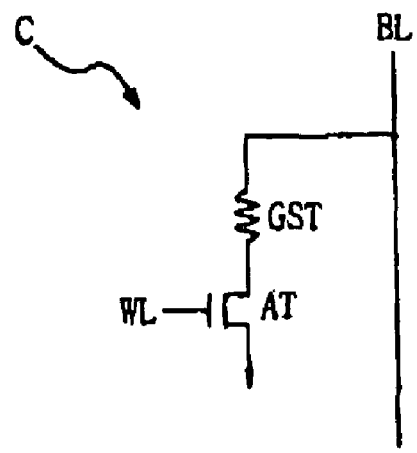
FIG. 1 is a circuit diagram of a conventional phase change memory cell.
Figure 2:
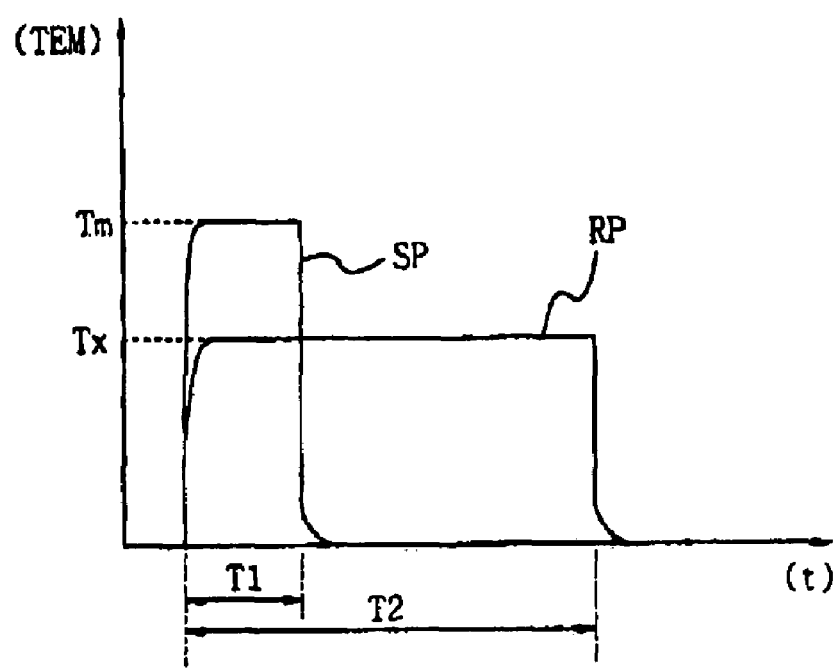
FIG. 2 is a graph illustrating a phase change property over time in view of temperature for a phase change material shown in FIG. 1.
Figure 3:
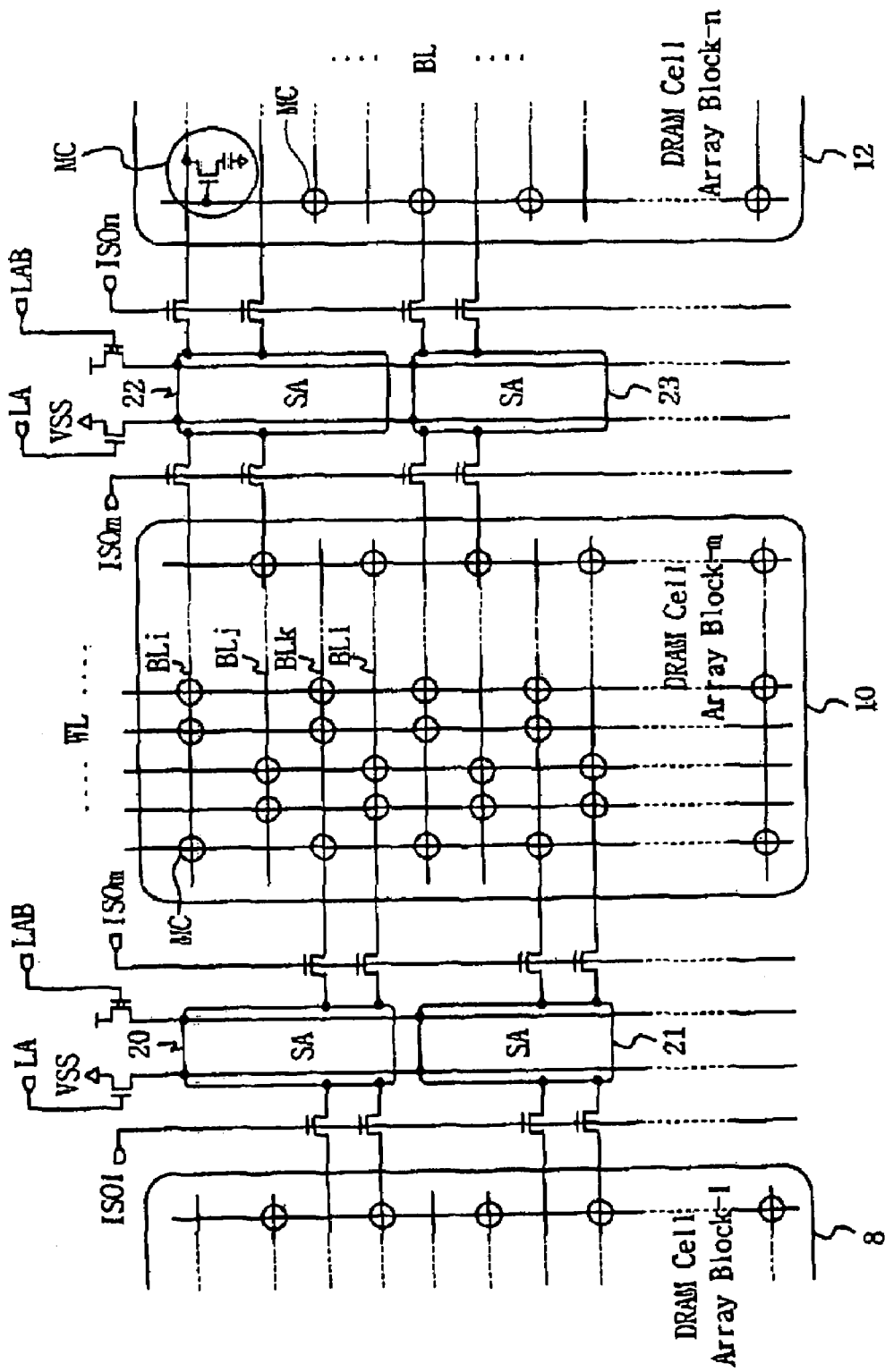
FIG. 3 illustrates a memory core circuit for use in a conventional DRAM.

Referring to FIG. 3, DRAM cell array blocks 8, 10 and 12 are connected with sense amplifiers 20, 21, 22 and 23. As shown in FIG. 3, a DRAM cell is large enough to include one sense amplifier (SA) per four bit line pitch. Referring to the SA 22, the SA 22 is shared by the memory cell array blocks 10 and 12 positioned on the right and left sides of the SA 22. Referring to the memory cell array block 10, the SAs 20 and 21 are disposed on the left side thereof, and the SAs 22 and 23 are disposed on the right side thereof. The sense amplifiers 20, 22 are respectively connected with bit line pairs BLk and BL1, and BLi and BLj of the memory cell array block 10.

As shown in FIG. 3, certain cross points of word lines WL and bit line pairs BLk and BL1, and BLi and BLj are not connected to a memory cell of the memory cell array blocks 8, 10 and 12. For example, when selecting one of the word lines WL, a memory cell is on a cross point of the selected word line WL and a bit line BLi, but is not on a cross point of the selected word line WL and a complementary bit line BLj. In this case, when the complementary bit line BLj is not connected to a memory cell, a corresponding SA serves as a reference voltage line necessary for sensing a voltage level of the bit line BLi. In such a structure, data of memory cells connected to the same word line is sensed and amplified by each corresponding sense amplifier, and then is latched. The data latched by each sense amplifier changes only a column address, and thus is outputted at one time in the same output cycle to realize a burst read operation in a DRAM.

Figure 4:
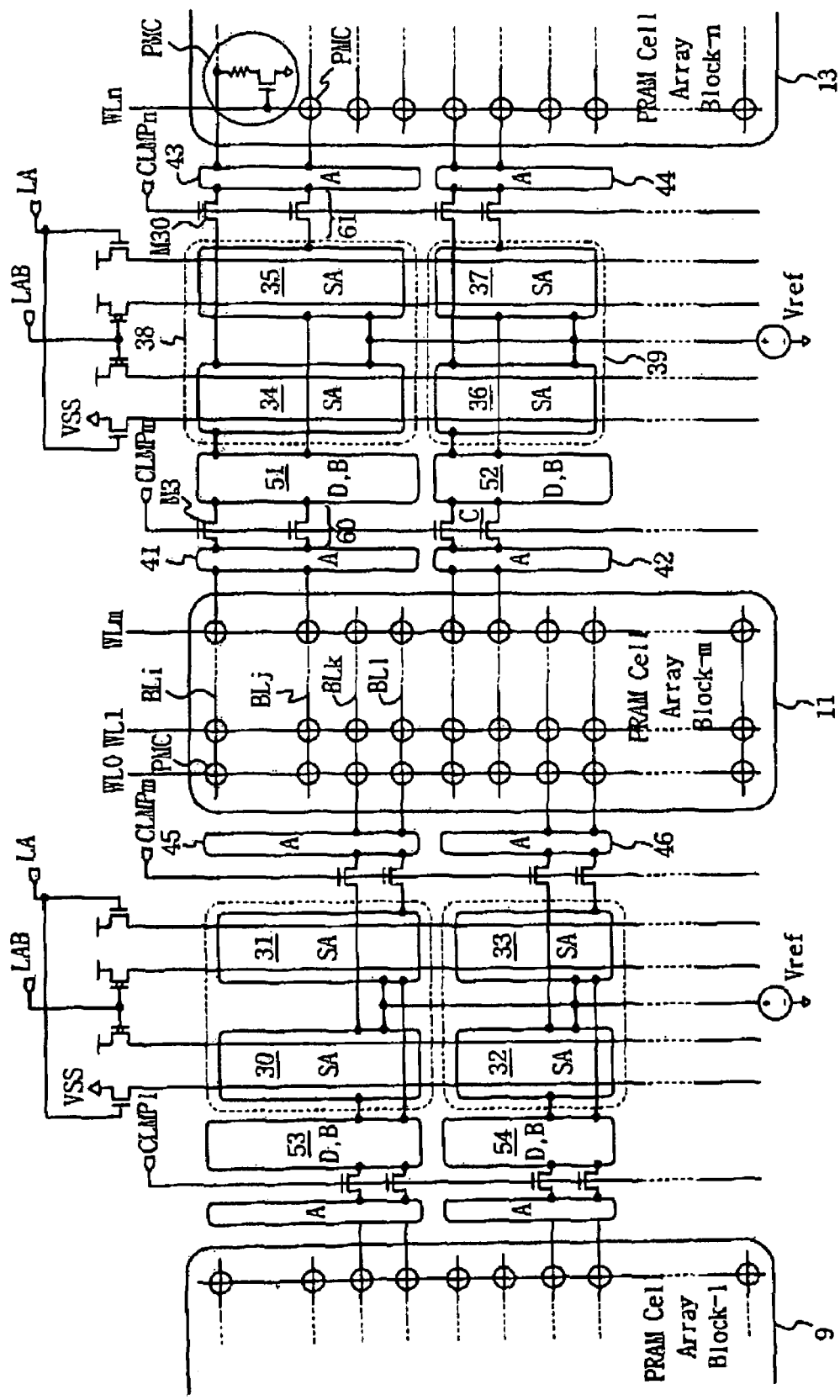
FIG. 4 illustrates a memory core circuit for use in a phase change memory device according to an exemplary embodiment of the invention.

FIG. 4 illustrates a memory core circuit for use in a phase change memory device according to an exemplary embodiment of the invention. With reference to FIG. 4, PRAM cell array blocks 9, 11 and 13 are connected with sense amplifiers 30-37. Assuming that a size of a PRAM cell is almost equal to that of a DRAM cell, a width of one SA may have a size corresponding to a four bit line pitch. All cross points of word lines WL and bit lines BLi within the PRAM cell array blocks 9, 11 and 13 are connected to a phase change memory cell. Though omitted from the drawing, the word lines WL are generally connected to an output of a row decoding part for decoding a row address.

As shown in FIG. 4, one phase change memory cell is connected to each cross point of the word lines WL and bit lines BLi, and one SA is connected to each bit line BLi. In FIG. 4 the number of SAs per one cell array block is two. Hence, SAs are disposed in two lines between cell array blocks. An externally applied voltage is used as a reference voltage Vref for the SAs and its voltage level may be, e.g., half a power source voltage.

FIG. 4 also shows other circuits for use with a burst read operation. They are, for example, bit line pre-discharge parts 41 to 46, clamp parts 60 and 61 and current supply and sense line pre-discharge parts 51 and 52.

Figure 5:
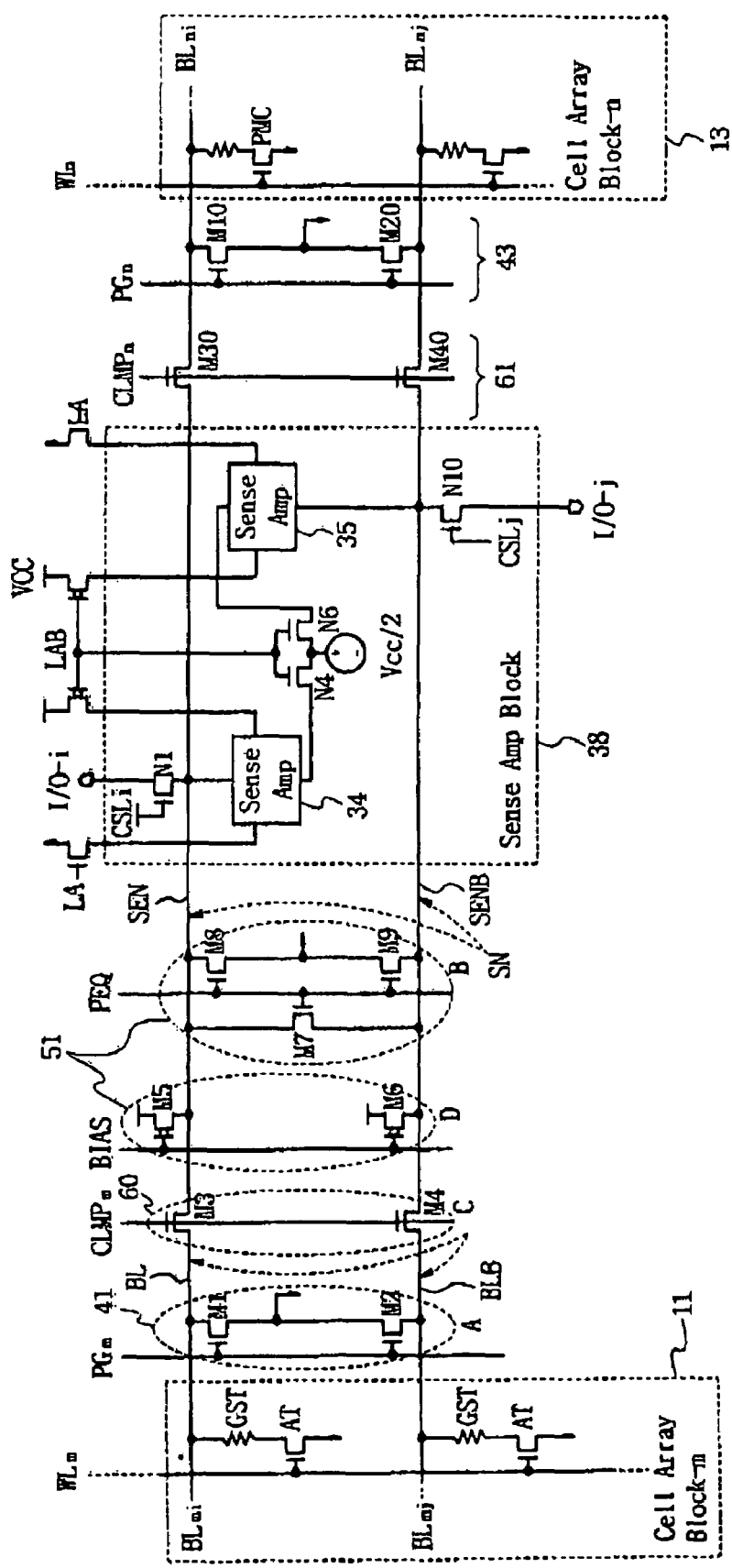
FIG. 5 is a circuit diagram partially illustrating the circuit of FIG. 4.

FIG. 5 shows in more detail the circuits located between the PRAM cell array blocks 11 and 13 and sense amplifiers 34 and 35 shown in FIG. 4. In FIG. 5, transistors N1, N4, N6, N10 and their wiring relationships within SA block 38 are added, which are not indicated in detail in FIG. 4. Referring to FIG. 5, a wiring relationship between components of an SA block shown in FIG. 4 and its neighboring PRAM cells are shown. In FIG. 5 all circuits relating to a selection of a cell array block and reading of cell data involving an SA block 38, which includes sense amplifiers 34 and 35, are shown. As shown in FIGS. 4 and 5, the SA blocks include pre-discharge parts A and B for pre-discharging bit lines and sense lines, a clamp part C, a current supply part D for supplying a reading current to a memory cell, the sense amplifiers 34 and 35 for outputting an amplified voltage value obtained by sensing data stored in a cell, and an external voltage source.

Figure 6:
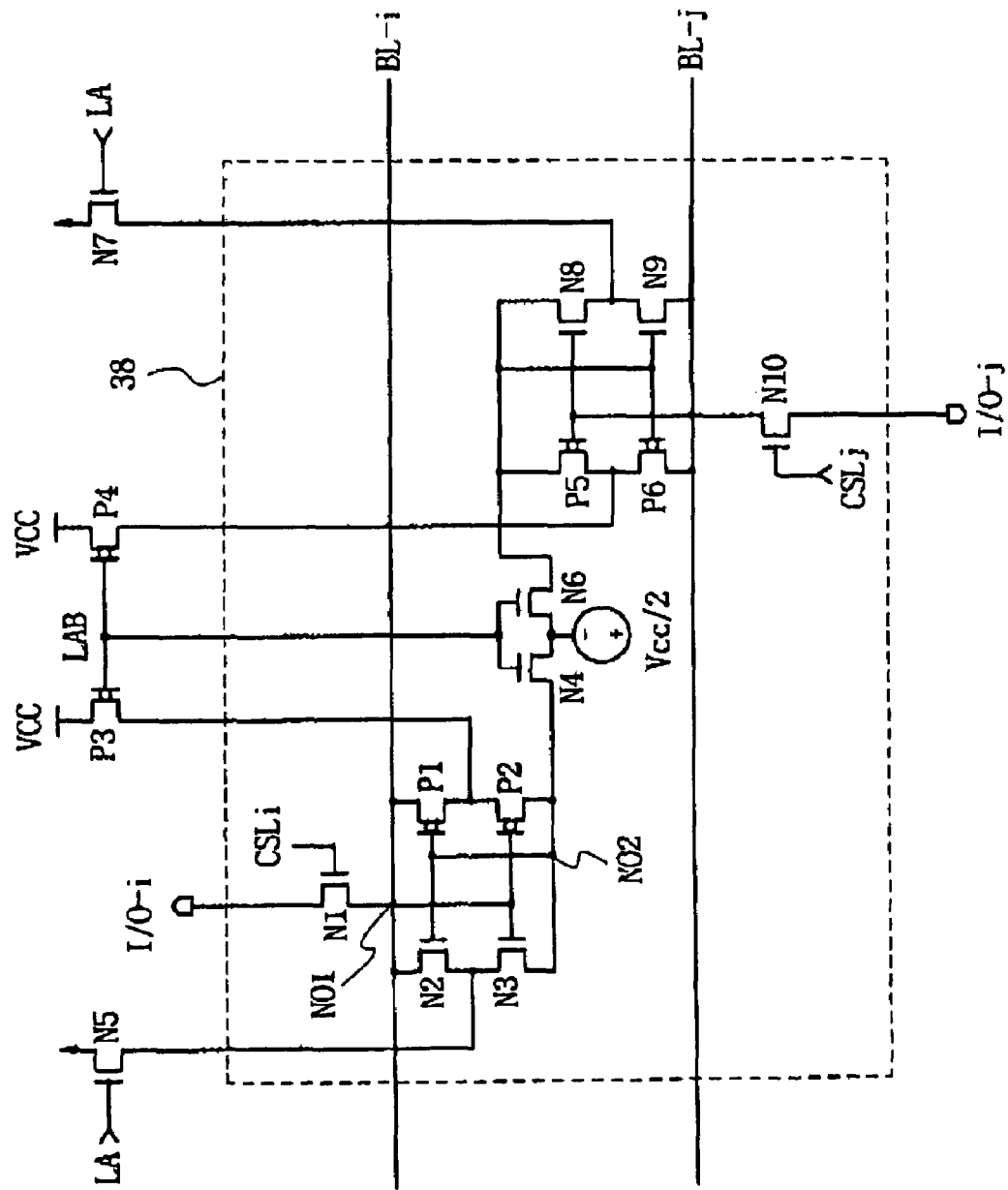
FIG. 6 is a circuit diagram illustrating a sense amplifier block of FIG. 5.

FIG. 6 illustrates an internal configuration of the sense amplifiers 34 and 35 shown in FIG. 5. Referring to FIG. 6, the sense amplifier 34 is constructed of N-type Metal Oxide Semiconductor (MOS) transistors N2 and N3 and P-type MOS transistors P1 and P2, to constitute an inverter latch. The sense amplifier 35 is constructed of N-type MOS transistors N8 and N9 and P-type MOS transistors P5 and P6, to constitute an inverter latch.

Figure 7:
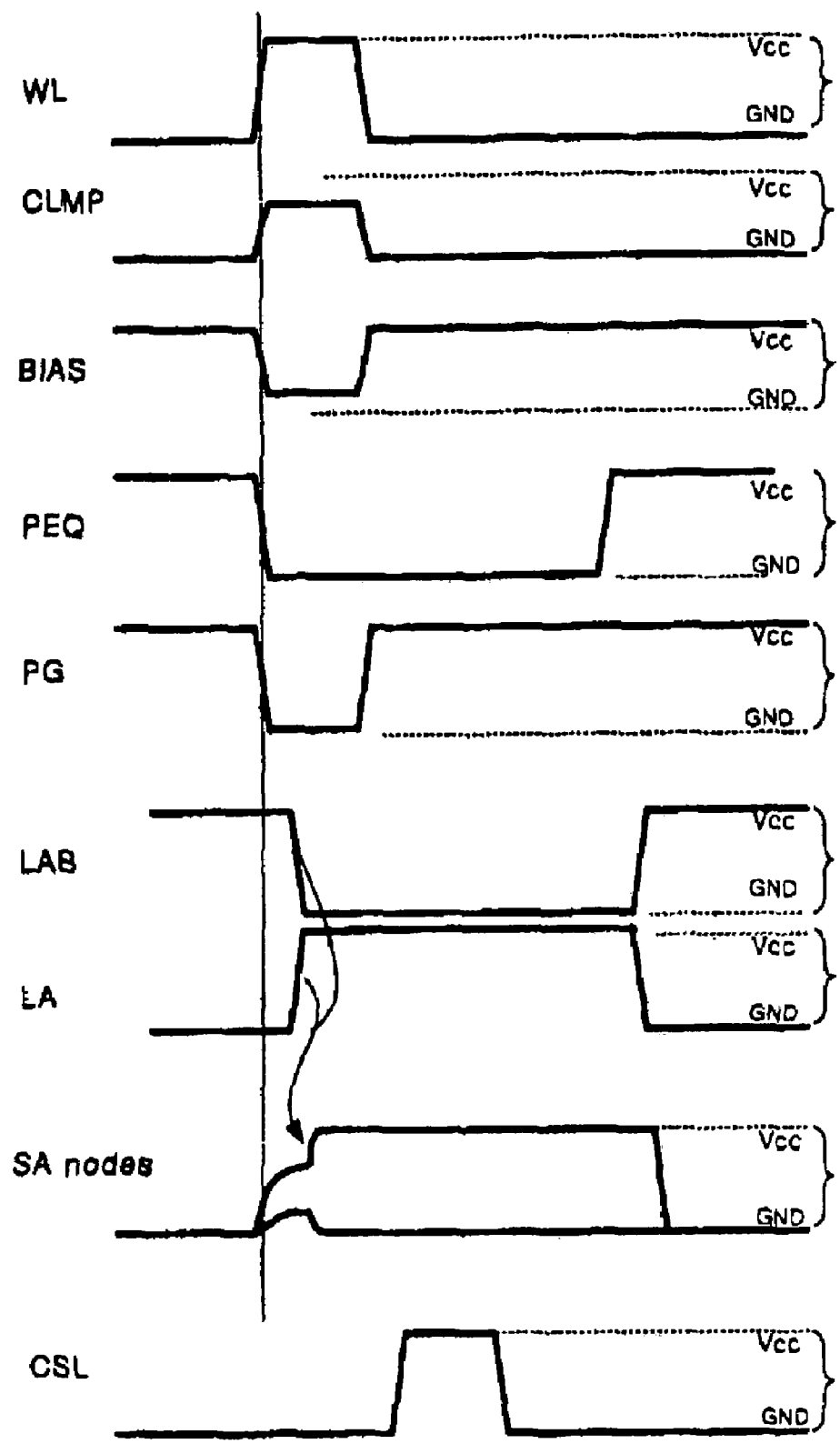
FIG. 7 is a timing diagram for illustrating a read operation referred to in FIG. 5.

A burst read operation in the PRAM memory core circuit having such a configuration will be described, mainly referring to FIG. 7, as follows. FIG. 7 is a timing diagram illustrating the read operation, and has reference symbols similar to that of the symbols shown in FIG. 5.

Referring to FIG. 7, voltage waveforms of control signals and sensing nodes for the read operation are illustrated. Before a PRAM goes into a read operating mode, PG and PEQ signals are each set to a high level. Then, a bit line BL and a sensing node SEN are each pre-discharged to a ground level. The read operating mode starts when the pre-discharge signals PEQ and PG are each disabled to a low level. When a word line WLm corresponding to an inputted row address is selected, access transistors AT constituting a phase change memory cell are turned on. Thus, a current path is formed between a GST of a memory cell connected to a bit line BL and a ground GND. Here, for example, assuming that a memory cell provided in an upper left side of FIG. 5 is selected, signals BIAS and CLMPm are set to a level such that bias transistors M5 and M6 within the current supply part D are turned on. An amount of current is supplied to the current path to generate a voltage level at a sensing node SEN, which varies depending on the resistance state of the GST of the memory cell. At this time, clamp transistors M3 and M4 enabled by the signal CLMPm are turned on. Then, the sense amplifier 34 of the SA block 38 of FIG. 5 forms an electrical connection with a selected cell array block 11. While clamp transistors responding to a signal CLMPn are turned off the electrical connection between the sense amplifier 35 of the SA block 38 and a non-selected cell array block 13 is cut off. In other words, the clamp part C performs electrical switching between a sense amplifier and a cell array block, and also performs a function for preventing a voltage of a bit line BL of a selected cell array block from going over a certain voltage level, e.g., 0.5 V. To perform the latter function a level of the signal CLMP should be controlled.

A level of the signal BIAS is used to determine the amount of current flowing in a cell and a voltage level of a sensing node SEN, thus control of the level of the signal BIAS is required. For example, if a selected memory cell has a relatively high resistance value at a reset state and a data 1, a level of the signal BIAS is set so that a voltage appearing on the sensing node SEN becomes higher than a reference voltage level, e.g., a level higher than half the power source voltage, which is VCC/2. Meanwhile, if a selected memory cell has a relatively low resistance value at a set state and a data 0, a level of the signal BIAS is determined so that a voltage appearing on the sensing node SEN becomes a level that is lower than half the power source voltage.

An operation of the sense amplifier 34 activated as described above in the SA block 38 will be described as follows.

An amplification of the SA 34 includes all operations associated with increasing a voltage appearing on the sensing node SEN to a level of the power source voltage VCC when a voltage level of the sensing node SEN or NO1 as shown in FIG. 6 is higher than a reference voltage level. The amplification of the SA 34 also includes all operations associated with decreasing a voltage level appearing on the sensing node SEN to a ground level when a voltage level of the sensing node SEN is lower than a reference voltage level.

At a point when a voltage level of the sensing node SEN or NO1 connected to the SA 34 reaches a predetermined level as shown in FIG. 7, signals LA and LAB are provided at high and low levels. Then, the N-type and P-type transistors N5 and P3 shown in FIG. 6 are turned on, and the SA 34 is activated. Thus, a voltage level of the sensing node shown in FIG. 5 is amplified to a CMOS power source voltage VCC level, and a level of the amplified voltage is latched by a latch operation of the sense amplifier 34. Simultaneous to the latch operation, a reference voltage switching transistor N4 of FIG. 6 is turned off, thus half of the power source voltage, which is a reference voltage Vref, is not applied to a reference voltage node NO2 of the SA 34. In other words, a connection with the reference voltage is cut off. Then, the reference voltage node NO2 becomes floating and is converted into a low level having a level opposite that of the sensing node NO1.

As described above, data of all memory cells connected to the same word line are simultaneously latched to each corresponding sense amplifier, and then a column address is applied. Subsequently, a corresponding column selection line CSL is selected by a column decoder as shown in FIG. 7, and data stored in a corresponding sense amplifier is output to the outside through a data line I/O-i. At this time, when an active state of a row address remains intact, a column address is sequentially changed in conformity with a clock, and then latched data is sequentially output. Thereby, a burst read operation is obtained.

As described above, according to an exemplary embodiment of the invention, a burst read operation is performed during a high-speed output of data. In addition, a read performance of a phase change memory device is enhanced.

While the present invention has been particularly shown and described with reference to exemplary embodiments thereof, it will be understood by those skilled in the art that various changes in form and details may be made therein without departing from the spirit and scope of the present invention as defined by the appended claims. For example, an internal configuration of a sense amplifier may be changed. Accordingly, these and other changes and modifications are seen to be within the spirit and scope of the invention as defined by the appended claims.

What is claimed is:

1. A phase change memory device, comprising:
   a plurality of bit lines and a plurality of word lines;
   a first memory cell array block having a plurality of phase change memory cells connected to cross points of the plurality of bit lines and the plurality of word lines; and
   a sense amplifier block, which is connected to the plurality of bit lines, wherein the sense amplifier block latches data of the memory cells connected to the same word line simultaneously during a burst read operation, and provides the latched data in response to a column address.

2. The device of claim 1, wherein the sense amplifier block includes:
   sense amplifiers connected to each bit line of the sense amplifier block.

3. The device of claim 2, wherein the sense amplifiers include a plurality of N-type MOS transistors coupled to a plurality of P-type MOS transistors forming an inverter latch.

4. The device of claim 2, wherein the sense amplifiers are disposed in two lines between the first memory cell array block and a second memory cell array block.

5. The device of claim 4, wherein a sense reference voltage applied to the sense amplifiers is an externally applied reference voltage.

6. The device of claim 5, wherein the sense reference voltage has a level that is half a power source voltage.

7. The device of claim 5, wherein the sense reference voltage is not applied to a first sense amplifier of the sense amplifiers after activating a second sense amplifier of the sense amplifiers.

8. The device of claim 1, wherein the memory cells include a phase change material formed of $Ge_xSb_yTe_z$.

9. The device of claim 1, further comprising:
   a plurality of pre-discharging parts that discharge a plurality of sense lines and the plurality of bit lines;
   a clamping part that electrically switches between one of the sense amplifiers and one of the first memory cell array block and a second memory cell array block and that prevents a voltage of one of the plurality of bit lines from exceeding a predetermined level; and
   a current supply part that supplies a reading or writing current to one of the first memory cell array block or a second memory cell array block.

10. A method for reading data in a phase change memory device, which includes a plurality of bit lines and a plurality of word lines, a memory cell array block having a plurality of phase change memory cells that are connected with cross points of the plurality of bit lines and the plurality of word lines, and a sense amplifier block connected to the bit lines, the method comprising:
    selecting one word line from the plurality of word lines;
    latching, simultaneously, data of memory cells connected to the selected word line; and
    outputting the latched data during a read cycle in response to a column address.

11. The method of claim 10, wherein the one word line corresponds to a row address.

12. The method of claim 10, wherein when selecting the one word line from the plurality of word lines, an access transistor of one of the memory cells is turned on to form a current path between a variable resistor and one of the memory cells connected to one of the plurality of bit lines and a ground.

13. The method of claim 12, further comprising:
    supplying a current to the current path to determine a resistance state of the variable resistor.

14. The method of claim 10, further comprising:
    forming an electrical connection between a sense amplifier of the sense amplifier block and a selected memory cell array block.

15. The method of claim 10, further comprising:
    applying a column address after latching the data of memory cells connected to the selected word line.

16. The method of claim 10, wherein the column address is sequentially changed.

17. The method of claim 16, wherein the column address is sequentially changed when an active state of a row address remains intact.

* * * * *